United States Patent
Fukami et al.

(10) Patent No.: US 12,405,769 B2
(45) Date of Patent: Sep. 2, 2025

(54) RANDOM NUMBER GENERATION UNIT AND COMPUTING SYSTEM

(71) Applicant: TOHOKU UNIVERSITY, Sendai (JP)

(72) Inventors: Shunsuke Fukami, Sendai (JP); William Andrew Borders, Sendai (JP); Takuya Funatsu, Sendai (JP); Shun Kanai, Sendai (JP); Keisuke Hayakawa, Sendai (JP); Hideo Ohno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 972 days.

(21) Appl. No.: 17/609,123

(22) PCT Filed: May 25, 2020

(86) PCT No.: PCT/JP2020/020469
§ 371 (c)(1),
(2) Date: Nov. 5, 2021

(87) PCT Pub. No.: WO2021/002115
PCT Pub. Date: Jan. 7, 2021

(65) Prior Publication Data
US 2022/0350572 A1    Nov. 3, 2022

(30) Foreign Application Priority Data
Jul. 3, 2019   (JP) .................................. 2019-124113

(51) Int. Cl.
*G06F 7/58* (2006.01)
(52) U.S. Cl.
CPC .................................... *G06F 7/588* (2013.01)
(58) Field of Classification Search
CPC ................................................ G06F 7/58–588
See application file for complete search history.

(56) References Cited

U.S. PATENT DOCUMENTS

| | | | |
|---|---|---|---|
| 2010/0109660 A1 | 5/2010 | Wang et al. | |
| 2010/0131578 A1* | 5/2010 | Fukushima | G06F 7/588 708/250 |

(Continued)

FOREIGN PATENT DOCUMENTS

| | | | | |
|---|---|---|---|---|
| JP | 2008-310403 A | | 12/2008 | |
| JP | 2011013901 A | * | 1/2011 | |
| JP | 2011113136 A | * | 6/2011 | G06F 7/588 |

OTHER PUBLICATIONS

Apr. 8, 2021 International Preliminary Report on Patentability issued in International Patent Application No. PCT/JP2020/020469.

(Continued)

*Primary Examiner* — Matthew D Sandifer
(74) *Attorney, Agent, or Firm* — Oliff PLC

(57) ABSTRACT

A random number generation unit and a computing system using the same, the unit including a magnetic tunnel junction element and being capable of developing the characteristics required for the execution of probabilistic computing and operating at a higher speed. A magnetic tunnel junction element includes a fixed layer having a ferromagnet and having a magnetization direction fixed substantially, a free layer having a ferromagnet and having a magnetization direction varying with a first time constant, and a barrier layer disposed between the layers configured with an insulator. The magnetic tunnel junction element has a shift magnetic field of an absolute value of 20 millitesla or smaller. The fixed layer has a plurality of ferromagnetic and non-magnetic coupling layers laminated one upon another, and ferromagnetic layers adjacent to each other among the respective ferromagnetic layers are coupled in terms of magnetization by the non-magnetic coupling layers in an antiparallel manner.

8 Claims, 8 Drawing Sheets

(56) References Cited

U.S. PATENT DOCUMENTS

2016/0202954 A1* 7/2016 Manipatruni ....... H01F 10/3254
708/250
2018/0165065 A1 6/2018 Kuo et al.

OTHER PUBLICATIONS

Camsari et al., "Stochastic p-Bits for Invertible Logic," Physical Review X, 2017, vol. 7, pp. 031014-1-031014-19.
Camsari et al., "Implementing p-bits With Embedded MTJ," IEEE Electron Device Letters, Dec. 2017, vol. 38, No. 12, pp. 1767-1770.
Lv et al., "A Single Magnetic-Tunnel-Junction Stochastic Computing Unit," IEEE International Electron Devices Meeting (IEDM), 2017, pp. 36.2.1-36.2.4.
Bapna et al., "Current control of time-averaged magnetization in superparamagnetic tunnel junctions," Applied Physics Letters, 2017, vol. 111, pp. 243107-1-243107-4.
Mizrahi et al., "Neural-like computing with populations of superparamagnetic basis functions," Nature Communications, 2018, vol. 9, No. 1533, pp. 1-11.
Zink et al., "Telegraphic switching signals by magnet tunnel junctions for neural spiking signals with high information capacity," Journal of Applied Physics, 2018, vol. 124, pp. 152121-1-152121-5.
Parks et al., "Superparamagnetic perpendicular magnetic tunnel junctions for true random No. generators," AIP Advances, 2018, vol. 8, pp. 055903-1-055903-5.
Rippard et al., "Thermal relaxation rates of magnetic nanoparticles in the presence of magnetic fields and spin-transfer effects," Physical Review B, 2011, vol. 84, pp. 064439-1-064439-7.
Parks et al., "Magnetoresistance Dynamics in Superparamagnetic Co—Fe—B Nanodots," Physical Review Applied, 2020, vol. 13, pp. 014063-1-014063-9.
Jul. 28, 2020 International Search Report issued in International Patent Application No. PCT/JP2020/020469.

* cited by examiner (a)

(b)

(a)

(b)

(a)

(b)

RANDOM NUMBER GENERATION UNIT AND COMPUTING SYSTEM

FIELD OF THE INVENTION

The present invention relates to a random number generation unit and a computing system using the same.

DESCRIPTION OF RELATED ART

Computing systems in prior arts are capable of efficiently executing large-scale processing by iteration such as of four arithmetic operations but are not good at coping with processing with complexity such as of optimization problems. In recent years, probabilistic computing has been expected as calculation principle allowing to execute the processing relatively easily with complexity which the computing systems in prior arts are not good at. The important issue is the development of the computing system hardware dedicated to probabilistic computing.

A computing system dedicated to probabilistic computing requires a random number generation unit which is configured to output one number, 0 or 1, at random temporally and to be controllable in the output rate of 0 or 1 by external input current (or voltage). The random number generation unit is required to have a circuit or a solid element which is capable of generating an output signal at random. In the case where the external input current (or voltage) is sufficiently large in the positive direction (or in the negative direction), the output by the circuit or the solid element needs to be fixed to 0. In the case where the external input current (or voltage) is sufficiently large in the negative direction (or in the positive direction), the output needs to be fixed to 1.

In recent years, a magnetic tunnel junction element has been expected as the solid element which is capable of generating an output signal at random. A typical magnetic tunnel junction element is configured with a fixed layer which is configured with a ferromagnet and in which the magnetization direction thereof is fixed, a free layer which is configured with a ferromagnet and in which the magnetization direction thereof varies freely, and a barrier layer which is formed between the fixed layer and the free layer. The utilization of a tunneling magneto resistance effect allows to detect the magnetization direction in the free layer depending on whether the electric resistance is high or low, and information is thus assigned to 0 and 1 for the utilization. The magnetic tunnel junction element is designed so as not to easily change in the magnetization direction against a thermal disturbance and is thereby allowed to be applied as a storage element of a nonvolatile memory. On the other hand, the magnetic tunnel junction element is designed so as to easily change in the magnetization direction against a thermal disturbance and is thereby allowed to be applied as a solid element which generates an output signal at random, into a computing system configured to execute probabilistic computing. It is noted that the stability in the magnetization direction against a thermal disturbance is called thermal stability, and the value obtained by dividing an energy barrier E between two states by a thermal disturbance $k_BT$ ($E/k_BT$) is called a thermal stability index.

In an example, the proposed method for realizing probabilistic computing is based on the numerical calculation on the assumption of a virtual magnetic tunnel junction element designed with a thermal stability index of substantially zero (see, for example, Non-Patent Literature 1 or 2). Further, the experimental results on a magnetic tunnel junction element with a low thermal stability index are disclosed (see, for example, Non-Patent Literatures 3 to 6). The observation results are reported, of the fluctuation state of element resistance caused by heat without application of external input in the magnetic tunnel junction element configured with the free layer and the fixed layer each formed as a single layer of a Co—Fe—B alloy having a perpendicular magnetization easy axis, and a barrier layer configured with MgO (see, for example, Non-Patent Literature 7).

It is noted that the physical definition is disclosed, of the time constant representing the frequency of temporal fluctuation in the magnetization direction of the magnetic tunnel junction element (see, for example, Non-Patent Literature 8).

In probabilistic computing, the operating speed of the random number generation unit is also important. As the random number generation unit operates faster, the calculation speed in probabilistic computing is higher, or the scale of the object to be coped with per predetermined time is greater. The operating speed herein of the random number generation unit means how many random number sequences including 0 and 1 are generated per unit time. In the case where the random number generation unit is configured with a magnetic tunnel junction element, the operating speed corresponds to the speed of the fluctuation caused by heat in the magnetic tunnel junction element. Accordingly, as the resistance fluctuates between a low-resistance state and a high-resistance state in a shorter time, the operating speed of the random number generation unit is higher. In prior arts, as for an operating speed of a random number generation unit, the time of 490 ns at the shortest has been reported as feature values of retention time of 0 and 1 (see, for example, Non-Patent Literature 9).

CITATION LIST

Non-Patent Literature 1: "Stochastic p-Bits for Invertible Logic" by Kerem Yunus Camsari, Rafatul Faria, Brian M. Sutton, and Supriyo Datta, Phys. Rev. X, vol. 7, 031014 in 2017

Non-Patent Literature 2: "Implementing p-bits With Embedded MTJ" by Kerem Yunus Camsari, Sayeef Salahuddin, Supriyo Datta, published in IEEE Electron Device Letters, vol. 38, 1767 in 2017

Non-Patent Literature 3: "A single magnetic-tunnel-junction stochastic computing unit" by Yang Lv, Jian-Ping Wang, published in IEEE International Electron Devices Meeting (IEDM) DOI: 10.1109/IEDM.2017.8268504, in 2017

Non-Patent Literature 4: "Current control of time-averaged magnetization in superparamagnetic tunnel junctions" by Mukund Bapna and Sara A. Majetich, Appl. Phys., Lett. vol. 111, 243107 in 2017

Non-Patent Literature 5: "Neural-like computing with populations of superparamagnetic basis functions" by Alice Mizrahi, Tifenn Hirtzlin, Akio Fukushima, Hitoshi Kubota, Shinji Yuasa, Julie Grollier & Damien Querlioz, Nature Communications, vol. 9, 1533 in 2018

Non-Patent Literature 6: "Telegraphic switching signals by magnet tunnel junctions for neural spiking signals with high information capacity" by Brandon R. Zink, Yang Lv, and Jian-Ping Wang, J. Appl. Phys., vol. 124, 152121 in 2018

Non-Patent Literature 7: "Superparamagnetic perpendicular magnetic tunnel junctions for true random number generators" by Bradley Parks, Mukund Bapna, Julianne Igbokwe, Hamid Almasi, Weigang Wang, and Sara A. Majetich, AIP Advances, vol. 8, 055903 in 2018

Non-Patent Literature 8: "Thermal relaxation rates of magnetic nanoparticles in the presence of magnetic fields and spin-transfer effects" by William Rippard, Ranko Heindl, Matthew Pufall, Stephen Russek, and Anthony Kos, Physical Review B, vol. 84, 064439 in 2011

Non-Patent Literature 9: "Magnetoresistance Dynamics in Superparamagnetic Co—Fe—B Nanodots" by Brad Parks, Ahmed Abdelgawad, Thomas Wong, Richard F. L. Evans, and Sara A. Majetich, Physical Review Applied, vol. 13, 014063 in 2020

SUMMARY OF THE INVENTION

In a major embodiment of a nonvolatile memory which utilizes a magnetic tunnel junction element with thermal stability designed to be sufficiently high, the magnetic tunnel junction element includes a free layer and a fixed layer each configured with a ferromagnet containing Fe and B, and a barrier layer configured with magnesium oxide (MgO). Both free layer and the fixed layer have easy axes of magnetization in the direction perpendicular to film planes (perpendicular magnetization easy axes). Accordingly, when the magnetic tunnel junction element with the thermal stability designed to be relatively low for use in probabilistic computing is configured with the same material system as the system of the magnetic tunnel junction element for a nonvolatile memory, the magnetic tunnel junction elements are able to be easily manufactured in the same facility.

Non-Patent Literature 7 has reported the observation results of the fluctuation state of element resistance caused by heat without application of external input in the magnetic tunnel junction element configured with the free layer and the fixed layer having perpendicular magnetization easy axes, but has not reported the results of the experiments carried out in terms of the response to the current (or voltage) input from the outside, of the magnetic tunnel junction element having perpendicular magnetization easy axis. Thus, the designing method has not been clearly disclosed, for the application to the random number generation unit and the computing system configured to execute probabilistic computing. Non-Patent Literatures 3 to 6 have disclosed the state of the response to the current input from the outside, of the magnetic tunnel junction element which has an in-plane magnetization easy axis and has the thermal stability designed to be low but have not disclosed the various characteristics required for the random number generation unit configured to execute probabilistic computing. In particular, the formation method has not been clearly disclosed, of the magnetic tunnel junction element capable of fixing the output to 1 by increasing the input current in the positive direction (or in the negative direction), and capable of fixing the output to 0 by increasing the input current in the negative direction (or in the positive direction).

Non-Patent Literature 9 has reported the value of 490 ns as a feature value of the retention time of 0 and 1. However, the method has not been clearly disclosed, for further improving the operating speed of the random number generation unit by shortening the retention time.

The present invention has been made focusing on these problems. It is an object of the present invention to provide a random number generation unit including a magnetic tunnel junction element and being capable of developing the characteristics required for the execution of probabilistic computing and of operating at a higher speed, and a computing system using the random number generation unit.

To attain the above object, the random number generating unit according to the present invention has a magnetic tunnel junction element, and the magnetic tunnel junction element has a fixed layer including a ferromagnet and having a magnetization direction fixed substantially, a free layer including a ferromagnet and having a magnetization direction varying with a first time constant, and a barrier layer configured with an insulator and disposed between the free layer and the fixed layer. The magnetic tunnel junction element has a shift magnetic field of an absolute value of 20 millitesla or smaller. The fixed layer has a plurality of ferromagnetic layers and non-magnetic coupling layers laminated one upon another, and ferromagnetic layers adjacent to each other among the respective ferromagnetic layers are coupled in terms of magnetization by the non-magnetic coupling layers in an antiparallel manner. The random number generating unit is configured to output one of two output signals at random temporally, and configured to be controllable a rate of the respective output signals by input current or input voltage.

In the random number generation unit according to the present invention, the absolute value of the shift magnetic field is designed to be 20 millitesla or smaller, and the random number generation unit is thus capable of developing the characteristics required for the execution of probabilistic computing. In the random number generation unit according to the present invention, the free layer preferably contains Fe and B, and the barrier layer preferably contains Mg and O. Further, in the case of the free layer having a plane substantially in a circular shape, the free layer preferably satisfies relation of $$500t-895<D<500t-855,$$

when D represents a diameter of the free layer (unit: nanometer), and t represents a film thickness of the free layer (unit: nanometer). In this case, the random number generation unit is capable of developing the characteristics especially excellent in the execution of probabilistic computing.

In the random number generation unit according to the present invention, the fixed layer and the free layer may have perpendicular magnetization easy axes, or may have in-plane magnetization easy axes. In the case of having the in-plane magnetization easy axes, the free layer preferably has a plane substantially in an oval shape with a length of a short axis in a range of 10 nm to 150 nm and a length of a long axis in a range of 1 to 2 times the length of the short axis. Furthermore, the free layer preferably has a film thickness in a range of 1.5 nm to 2.8 nm. In the case of having the in-plane magnetization easy axes as described above, a retention time in parallel state and a retention time in antiparallel state of the magnetization of the fixed layer and the magnetization of the free layer are especially shortened, and accordingly the random number generation unit is capable of operating at a higher speed.

The computing system according to the present invention has a weighted logic, a plurality of the random number generation units according to the present invention connected to the weighted logic, and a time averaging circuit. The time averaging circuit is configured to time average output signals of the respective random number generation units at a first time interval, and the first time constant is equal to or smaller than $\frac{1}{10}$ of the first time interval.

The computing system according to the present invention has the random number generation units according to the present invention and is thus suitable for probabilistic computing. Accordingly, the computing system is capable of preferably executing probabilistic computing.

The present invention allows the random number generation unit and the computing system using the same are provided, including the magnetic tunnel junction element and being capable of developing the characteristics required for the execution of probabilistic computing and of operating at a higher speed.

DETAILED DESCRIPTION OF THE INVENTION

The random number generation units of some embodiments according to the present invention and the computing systems using the same will be described with reference to the drawings hereinafter.

FIG. 1 to FIG. 14 show the random number generation unit in the first embodiment according to the present invention and the computing system using the same.

1. Basic Structure

Figure 1:
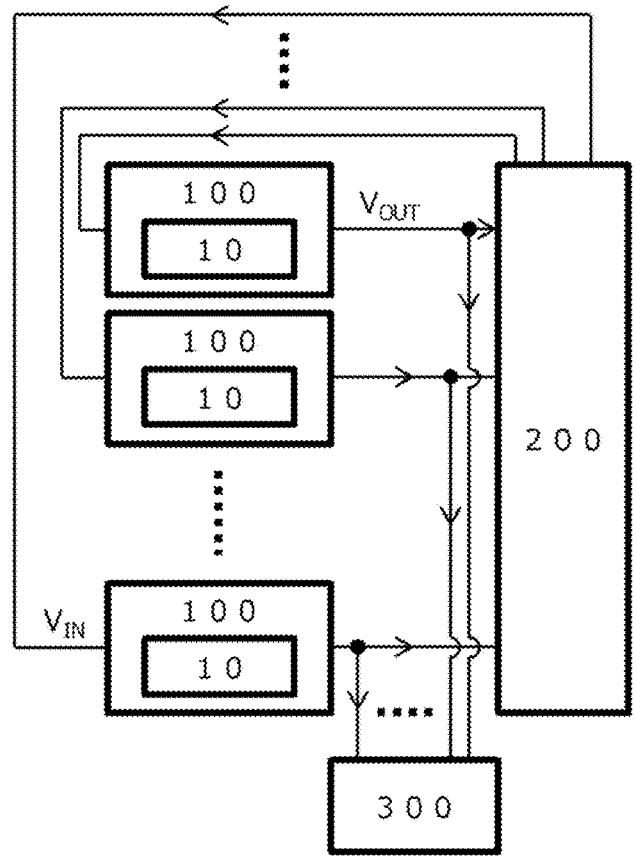
FIG. 1 shows a block diagram illustrating a computing system in a first embodiment according to the present invention.

FIG. 1 shows the block diagram of a computing system 1 in the first embodiment according to the present invention.

The computing system 1 includes a plurality of random number generation units 100 connected by a weighted logic 200, and a time averaging circuit 300. Each of the random number generation units 100 includes at least one magnetic tunnel junction (MTJ) element 10.

Figure 2:
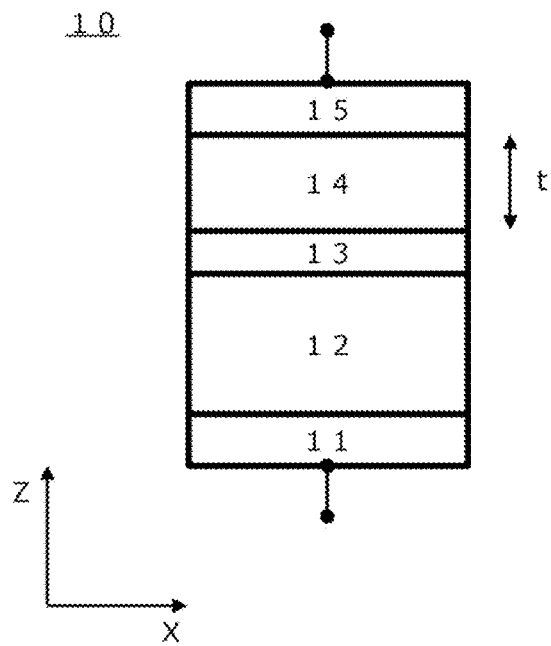
FIG. 2 includes (a) an X-Z sectional view and (b) an X-Y plan view each illustrating a structure of a magnetic tunnel junction element of a random number generation unit in the first embodiment according to the present invention.
Figure 2:
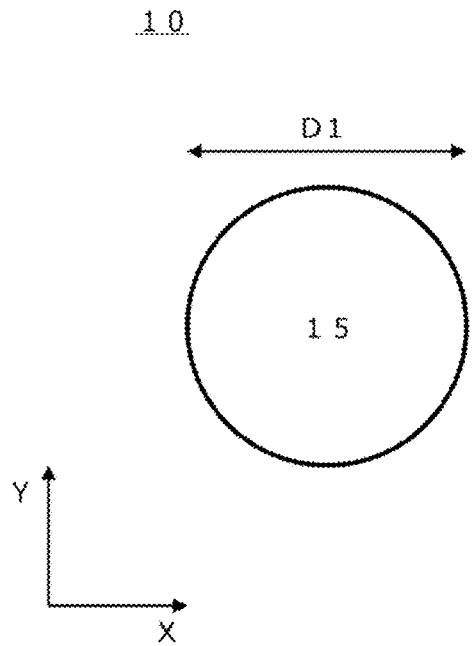
Figure 3:
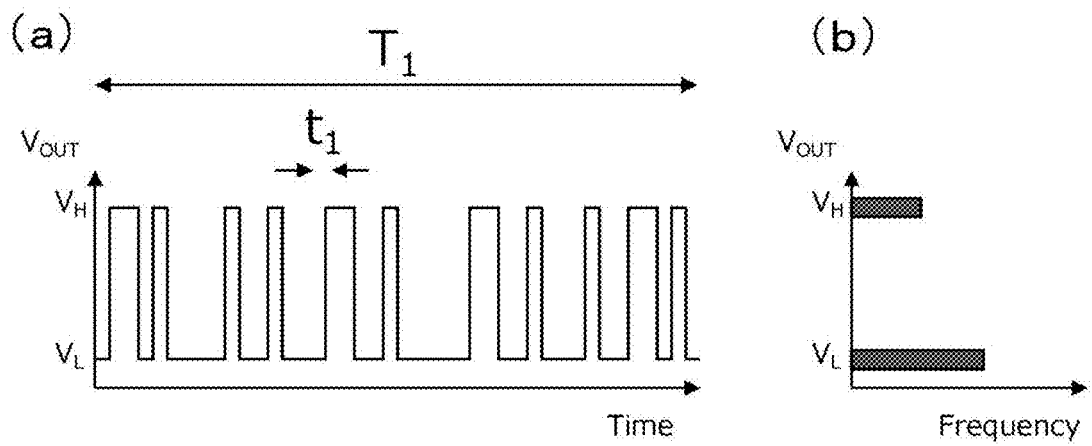
FIG. 3 includes (a) a graph showing temporal fluctuation of an output signal $V_{OUT}$ and (b) a histogram showing statistical values of the output signal $V_{OUT}$ at a time interval $T_1$, of the random number generation unit in the first embodiment according to the present invention.

FIG. 2 schematically shows the structure of the magnetic tunnel junction element 10. FIG. 2(a) shows the X-Z sectional view, and FIG. 2(b) shows the X-Y plan view. The magnetic tunnel junction element 10 shown in FIG. 2 has two terminals of an upper terminal and a lower terminal. The circuit structure of the random number generation unit 100 configured to execute probabilistic computing by use of the magnetic tunnel junction element 10 in such a two-terminal structure is disclosed in, for example, Non-Patent Literature 2, and thus the description thereof is omitted herein.

The magnetic tunnel junction element 10 includes a lower electrode 11, a fixed layer 12 provided adjacent to the upper surface of the lower electrode 11, a barrier layer 13 provided adjacent to the upper surface of the fixed layer 12, a free layer 14 provided adjacent to the upper surface of the barrier layer 13, and an upper electrode 15 provided adjacent to the upper surface of the free layer 14. It is noted that the free layer 14 and the fixed layer 12 may be arranged in the reversed order.

The fixed layer 12 has a ferromagnet, and the magnetization direction thereof is fixed substantially. The barrier layer 13 is configured with an insulator. The free layer 14 has a ferromagnet, and the magnetization direction thereof varies freely with a time constant $t_1$. In the random number generation unit 100 in the first embodiment according to the present invention, both of the fixed layer 12 and the free layer 14 have easy axes of magnetization in the direction perpendicular to the film planes (perpendicular magnetization easy axes). The lower electrode 11 and the upper electrode 15 are configured with metallic material. The lower electrode 11 and the upper electrode 15 are electrically connected to the wiring shown in the figure.

The magnetic tunnel junction element 10 has a film plane formed substantially in a circular shape with a diameter D1. Alternatively, at least the free layer 14 has the film plane formed substantially in the circular shape with the diameter D1. The free layer 14 has a film thickness t. The relation between the value of D1 and the value of t suitable for the embodiments according to the present invention will be described later based on experimental results.

2. Operation

The magnetic tunnel junction element 10 varies in resistance depending on the magnetization direction of the free layer 14, due to tunneling magneto resistance (TMR) effect. Accordingly, the random number generation unit 100 outputs $V_L$ and $V_H$ with the time constant $t_1$ at random as an output signal $V_{OUT}$. The output rate of $V_L$ and $V_H$ varies depending on an input signal $V_{IN}$ input to the random number generation unit 100 from the outside, as will be described later. FIG. 3(a) shows the state of the temporal fluctuation of the output signal $V_{OUT}$ output by the random number generation unit 100. As shown in the figure, the random number generation unit 100 outputs $V_L$ and $V_H$ as $V_{OUT}$ at random with the time constant $t_1$. FIG. 3(b) shows the statistical values in a histogram, of the output signal $V_{OUT}$ output by the random number generation unit 10 at a time interval $T_1$.

In the first embodiment according to the present invention, the computing system 1 implements probabilistic computing algorithm. In the probabilistic computing, the output signals $V_{OUT}$ output by the random number generation unit 100 are averaged at a certain time interval by the time averaging circuit 300. The value of the above-described $t_1$ is preferably 1/10 or smaller of the value of $T_1$, and more preferably 1/100 or smaller, where the time interval is $T_1$. Typically, the value of $t_1$ preferably falls within the range of 10 nanoseconds to 10 milliseconds, and the value of $T_1$ preferably falls within the range of 1 microsecond to 100 seconds. The value of $T_1$ is set depending on the scale of the object to be coped with and the accuracy of solution to be required. The value of $T_1$ needs to be set larger, as the scale of the object is larger, or as the accuracy of solution to be required is higher.

It is noted that Non-Patent Literature 8 discloses the physical definition of the time constant $t_1$. By referring to FIG. 3, the value of to $t_1$ corresponds to the inverse number of the inclination of the line plotted in the graph where a retention time in each state is set as a lateral axis and a logarithm (ln (number of events)) of the number of being retained in the state is set as a longitudinal axis.

Figure 4:
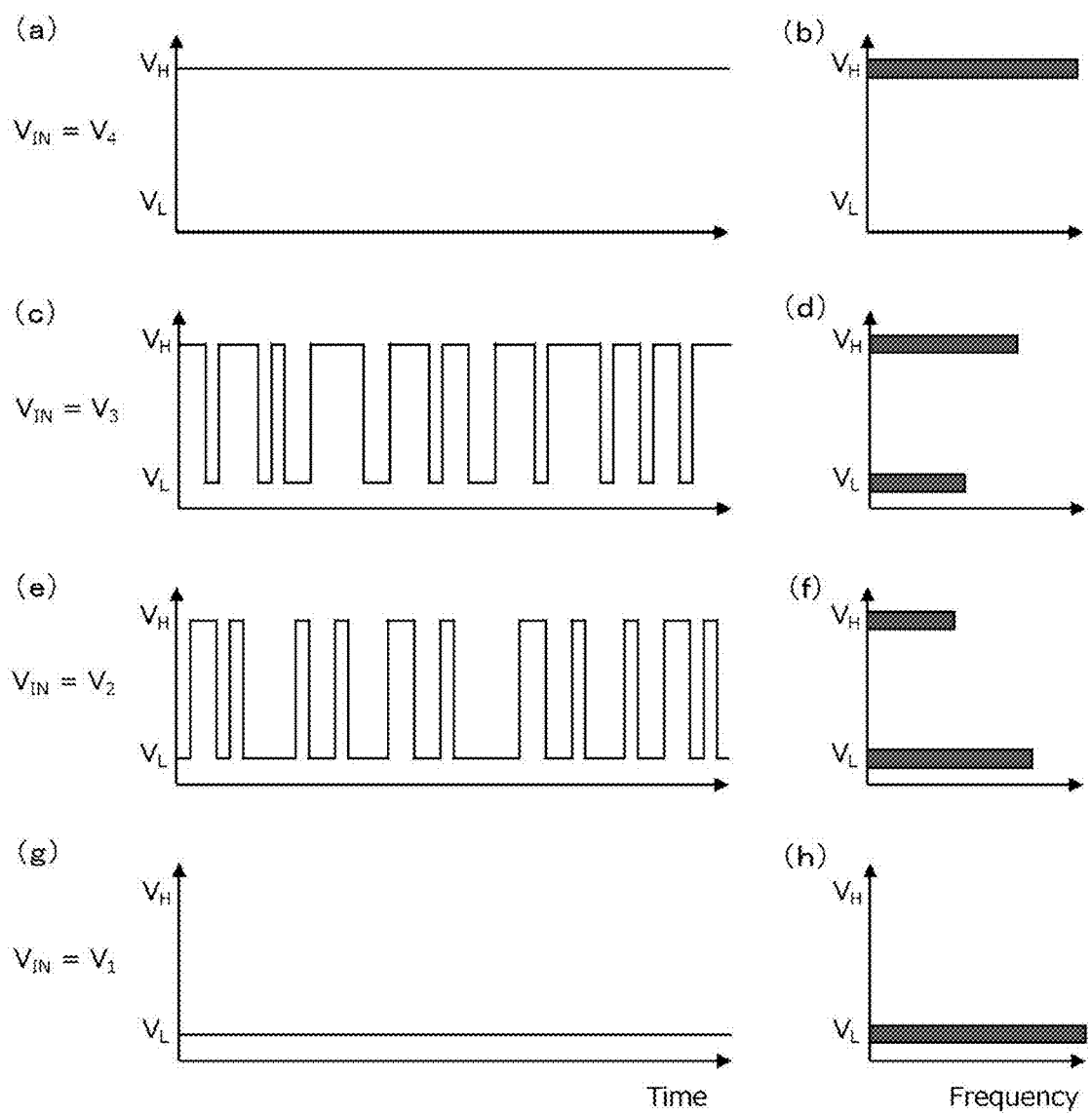
FIG. 4 includes (a) a graph showing the temporal fluctuation and (b) a histogram showing the statistical values, of the output signal $V_{OUT}$ at the time of an input signal $V_{IN}$ being equal to $V_4$ in the random number generation unit in the first embodiment according to the present invention, (c) a graph showing the temporal fluctuation and (d) a histogram showing the statistical values, of the output signal $V_{OUT}$ at the time of the input signal $V_{IN}$ being equal to $V_3$, (e) a graph showing the temporal fluctuation and (f) a histogram showing the statistical values, of the output signal $V_{OUT}$ at the time of the input signal $V_{IN}$ being equal to $V_2$, and (g) a graph showing the temporal fluctuation and (h) a histogram showing the statistical values, of the output signal $V_{OUT}$ at the time of the input signal $V_{IN}$ being equal to $V_1$.

FIG. 4 schematically shows the temporal fluctuation of the output signal $V_{OUT}$ and the histograms thereof in the cases where the input signal $V_{IN}$ input to the random number generation unit 100 is set to $V_1$, $V_2$, $V_3$ and $V_4$, respectively. Herein, the relation between the values of $V_1$, $V_2$, $V_3$ and $V_4$ satisfies $V_1>V_2>V_3>V_4$ or $V_1<V_2<V_3<V_4$. The positive/negative signs may be changed in the process where the input signal $V_{IN}$ is changed from $V_1$ to $V_2$, $V_3$ and $V_4$. As shown in the figure, when $V_{IN}=V_1$, the output signal $V_{OUT}$ is fixed to $V_L$, while when $V_{IN}=V_4$, the output signal $V_{OUT}$ is fixed to $V_H$. Such control of the output signal output by the random number generation unit 100 by use of the input signal is the requirement for the execution of probabilistic computing. It is noted that, in the random number generation unit 100, current is input to the magnetic tunnel junction element 10 in response to the input signal $V_{IN}$, and spin transfer torque (STT) thus affects the magnetization of the free layer 14, so that the response characteristics as described above is realized. Alternatively, an action other than the spin transfer torque may affect the magnetization of the free layer 14, thereby enabling to exploit the present invention.

3. Structure of Fixed Layer 12

The present inventors have found that, in the first embodiment according to the present invention, the fixed layer 12 of the magnetic tunnel junction element 10 is designed as follows, and this achieves the random number generation unit 100 capable of developing the input/output characteristics required for the computing system 1 configured to execute probabilistic computing, as described above.

Figure 5:
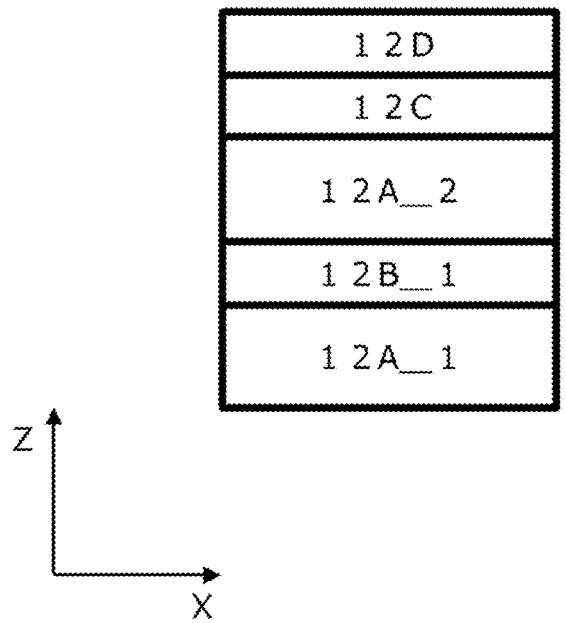
FIG. 5 shows an X-Z sectional view illustrating a structure of a fixed layer of the magnetic tunnel junction element of the random number generation unit in the first embodiment according to the present invention.

FIG. 5 schematically shows one example of the X-Z sectional structure of the fixed layer 12 in the first embodiment according to the present invention. The fixed layer 12 is configured with the laminated layers of, in order from a substrate side (from the side of the lower electrode 11), a first ferromagnetic fixed layer 12A_1, a first non-magnetic coupling layer 12B_1, a second ferromagnetic fixed layer 12A_2, an interlayer 12C, and a spin-polarized layer 12D.

The first ferromagnetic fixed layer 12A_1, the second ferromagnetic fixed layer 12A_2 and the spin-polarized layer 12D are configured with ferromagnets, and their magnetization directions are fixed substantially. The first non-magnetic coupling layer 12B_1 and the interlayer 12C are configured with non-magnetic metal material. The first ferromagnetic fixed layer 12A_1 and the second ferromagnetic fixed layer 12A_2 are coupled in terms of magnetization in an antiparallel manner via the first non-magnetic coupling layer 12B_1. The second ferromagnetic fixed layer 12A_2 and the spin-polarized layer 12D are coupled in terms of magnetization in a parallel manner via the interlayer 12C.

Figure 6:
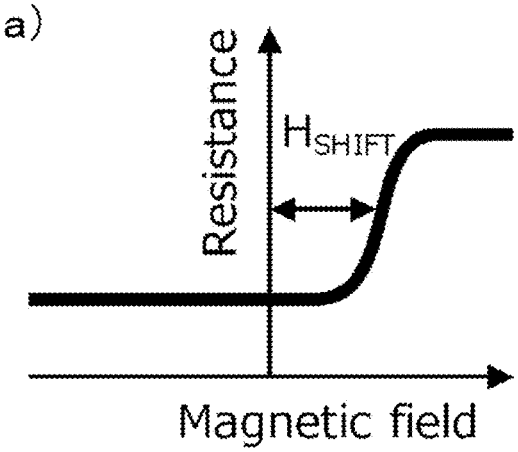
FIG. 6 includes (a) a graph showing relation between a resistance and an external magnetic field and (b) a graph showing relation between a resistance and an input current, in the magnetic tunnel junction element of the random number generation unit in the first embodiment according to the present invention.
Figure 6:
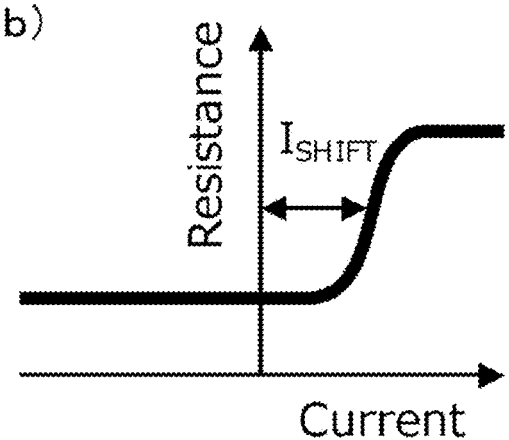

The characteristics of the responses to the external magnetic field and the input current of the free layer 14 vary depending on the structure of the fixed layer 12. Such state will be described with reference to FIG. 6. When there is a difference between the magnetic field to be generated in the free layer 14 by the components magnetized upwardly in the fixed layer 12 and the magnetic field to be generated in the free layer 14 by the components magnetized downwardly in the fixed layer 12, the free layer 14 receives the magnetic field (uncompensated magnetic field) generated by the fixed layer 12. As a result, as shown in FIG. 6, the response of the tunnel resistance of the magnetic tunnel junction element 10 to the external magnetic field (or the input current) is shifted by the amount of $H_{SHIFT}$ (or $I_{SHIFT}$) as a shift magnetic field (or a shift current) and becomes asymmetrical with respect to the zero magnetic field (or the zero input current). It is noted that the tunnel resistance shown in FIG. 6 means the value of the tunnel resistance of the magnetic tunnel junction element 10 averaged for a period of time sufficiently longer than the time constant $t_1$ described above. It is noted that the positive/negative signs of the external magnetic field and the input current depend on the definition. Accordingly, whether the resistance increases or decreases in response to the increase in the positive direction of the magnetic field or the current may depend on the definition.

The experiments carried out by the present inventors have revealed that the relation between $I_{SHIFT}$ (unit: microampere) and $\mu_0 H_{SHIFT}$ (unit: millitesla) satisfies $I_{SHIFT}=A$ ($\mu_0 H_{SHIFT}$), when A is a proportionality constant, and in the case where the diameter D1 of the magnetic tunnel junction element 10 is 60 nm, the value of A falls within the range of 1.03 to 1.15, while in the case where the diameter D1 is 50 nm, the value of A falls within the range of 0.91 to 1.02 (details will be described later). It is noted that $\mu_0$ is permeability in vacuum. The present inventors have found that the operation characteristics suitable for probabilistic computing as shown in FIG. 4 are able to be obtained when an absolute value of $H_{SHIFT}$ is 20 millitesla (mT) or smaller. Specific experimental results will be described later.

Figure 7:
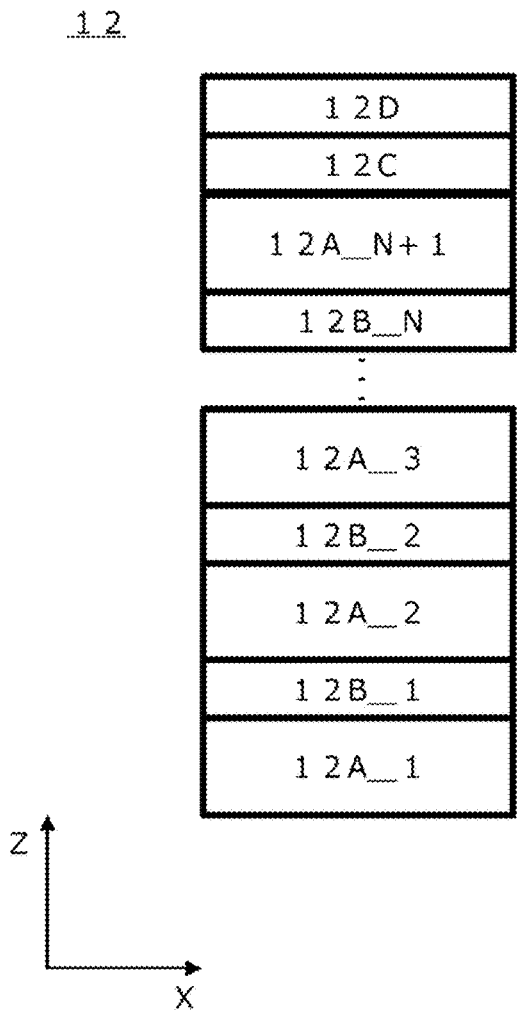
FIG. 7 shows an X-Z sectional view illustrating a structure of a modification of a fixed layer of the magnetic tunnel junction element of the random number generation unit in the first embodiment according to the present invention.

FIG. 7 schematically shows another example of the X-Z sectional structure of the fixed layer 12. In the example shown in FIG. 7, the fixed layer 12 is configured with the laminated layers of, in order from the substrate side (from the side of the lower electrode 11), the first ferromagnetic fixed layer 12A_1, the first non-magnetic coupling layer 12B_1, the second ferromagnetic fixed layer 12A_2, a second non-magnetic coupling layer 12B_2, a third ferromagnetic fixed layer 12A_3, to an Nth non-magnetic coupling layer 12B_N, an N+1th ferromagnetic fixed layer 12A_N+1, the interlayer 12C, and the spin-polarized layer 12D, when N is an integer of 2 or larger. The first ferromagnetic fixed layer 12A_1, the second ferromagnetic fixed layer 12A_2, the third ferromagnetic fixed layer 12A_3, to the N+1th ferromagnetic fixed layer 12A_N+1 have magnetization substantially fixed in antiparallel manner to adjacent ferromagnetic fixed layers via the first non-magnetic coupling layer 12B_1, the second non-magnetic coupling layer 12B_2, to the Nth non-magnetic coupling layer 12B_N, respectively. Such a structure allows more precise control of $H_{SHIFT}$ and $I_{SHIFT}$, thereby easily developing desired characteristics.

4. Material

The usable material for the respective layers of the magnetic tunnel junction element 10 and their film thicknesses will be described next.

Non-magnetic conductive metal is usable for the lower electrode 11 and the upper electrode 15. Specific examples include Ta, W, Ti, Ru, Cu, Cu—N, Ti—N, and Ta—N. Their film thicknesses are designed approximately in the range of 5 nanometers to 50 nanometers.

A conductive ferromagnet is usable for the first ferromagnetic fixed layer 12A_1, the second ferromagnetic fixed layer 12A_2, the third ferromagnetic fixed layer 12A_3, to the N+1th ferromagnetic fixed layer 12A_N+1 which are included in the fixed layer 12. Specific examples include Co, Co—Pt alloy, Co—Cr—Pt alloy, and Fe—Pt alloy. Alternatively, the material configured with a plurality of layers laminated one upon another may be used, such as, Co/Pt multilayer film, Co/Pd multilayer film, and Co/Ni multilayer film. These film thicknesses are designed approximately in the range of 0.2 nanometers to 5 nanometers.

Non-magnetic conductive material is usable for the first non-magnetic coupling layer 12B_1, the second non-magnetic coupling layer 12B_2, to the Nth non-magnetic coupling layer 12B_N which are included in the fixed layer 12. In particular, the material capable of coupling in an antiparallel manner with the ferromagnetic layer formed on the opposite surface by RKKY interaction shall be used. Specific examples include Ru, Ir, and Rh. Their film thicknesses are optimized and designed so as to obtain desired magnetic coupling by RKKY interaction, typically in the range of 0.3 nanometers to 1.5 nanometers.

Conductive metal material is usable for the interlayer 12C included in the fixed layer 12. In particular, the material which tends to become an amorphous state is used preferably. Specific examples include Ta, W, Hf, Nb, and Ti. The film thickness is designed approximately in the range of 0.2 nanometers to 1.0 nanometer.

Ferromagnetic metal having high spin polarization is usable for the spin-polarized layer 12D included in the fixed layer 12. Specific examples include Co—Fe—B alloy and Fe—B alloy. The film thickness is designed approximately in the range of 0.8 nanometers to 1.5 nanometers. Specific examples of the film structure of the fixed layer 12 include Co/Ir/Co/Ir/Co/Ir/Co/Ta/Co—Fe—B, Co/Ir/Co—Pt/Ir/Co/Ir/Co—Pt/W/Fe—B, and Co/Pt/Co/Ir/Co/Ta/Co—Fe—B. As described above, Co and Co—Pt are selectively used as ferromagnetic material depending on the magnitude of saturation magnetization, or alternatively Pt and Ir are selectively used as non-magnetic material depending on whether adjacent ferromagnetic layers are to be coupled in a ferromagnetic state or an antiferromagnetic state. These allow to adjust the shift magnetic field $H_{SHIFT}$ affecting the free layer 14 to be a desired magnitude or smaller.

Insulating non-magnetic material is usable for the barrier layer 13. In particular, MgO is used preferably. The film thickness is designed approximately in the range of 0.8 nanometers to 2.0 nanometers.

Ferromagnetic metal having high spin polarization is usable for the free layer 14. Specific examples include Co—Fe—B alloy and Fe—B alloy. The film thickness is designed approximately in the range of 0.8 nanometers to 3.0 nanometers. The relation between the film thickness t of the free layer 14 and the diameter $D_1$ will be described later based on the experimental results.

5. Modification 1

Figure 8:
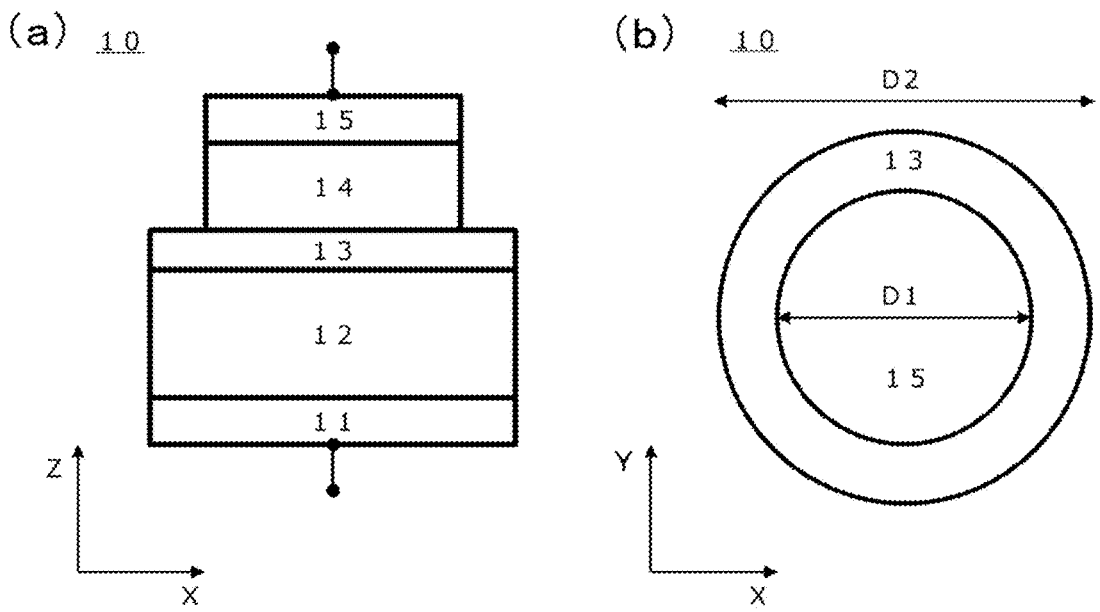
FIG. 8 includes (a) an X-Z sectional view and (b) an X-Y plan view each illustrating a structure of a first modification of a magnetic tunnel junction element of the random number generation unit in the first embodiment according to the present invention.

A modification of the magnetic tunnel junction element 10 will be described next. FIG. 8 shows the X-Z sectional view and the X-Y plan view each schematically illustrating the structure of a first modification of the magnetic tunnel junction element 10. In the first modification, the diameters of the free layer 14 and the upper electrode 15 are D1, and the diameters of the barrier layer 13, the fixed layer 12, and the lower electrode 11 are D2. The relation therebetween satisfies D2=D1+M, when M is a positive number. In the first modification, the absolute values of $H_{SHIFT}$ and $I_{SHIFT}$ described in FIG. 6 are able to be designed smaller. When M is 20 nanometers or larger, the present modification is effective.

6. Modification 2

Figure 9:
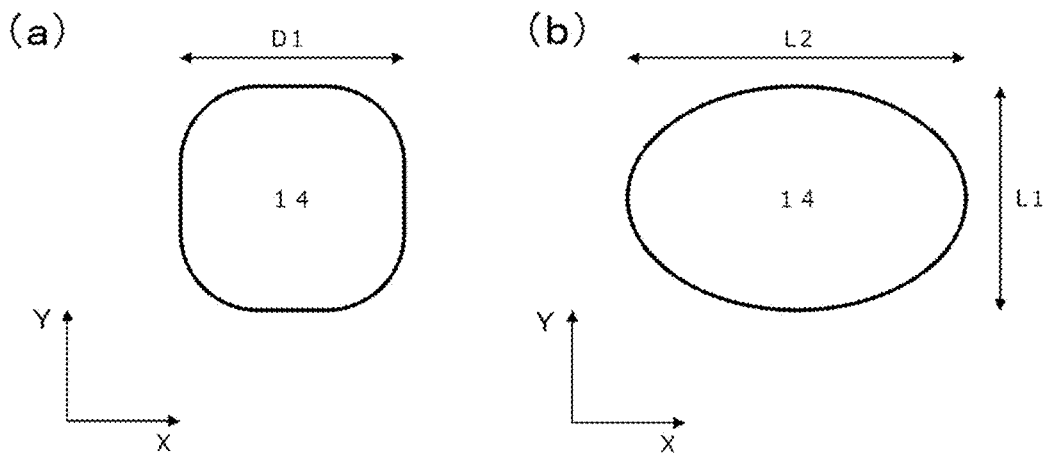
FIG. 9 shows (a) an X-Y plan view of a free layer having a plane formed in a square shape with rounded corners and (b) an X-Y plan view of a free layer having a plane formed in an oval shape, each illustrating a structure of a second modification of a magnetic tunnel junction element of the random number generation unit in the first embodiment according to the present invention.

FIG. 9 shows the X-Y plan views each schematically illustrating a second modification of the magnetic tunnel junction element 10. The second modification relates to the plane shape of the free layer 14. The free layer 14 may be formed in a square shape with rounded corners as shown in FIG. 9(a), or alternatively may be formed in an oval shape as shown in FIG. 9(b). In the case of such a square shape, the diameter D1 is defined as the length of one side. In the case of such an oval shape, a length L1 and a length L2 are defined respectively as the short axis and as the long axis, as shown in the figure, and the value of D1, which is important in the present invention, is obtained through (L1+L2)/2. The formation in such a square shape with rounded corners allows to reduce the cost in mask designing. The formation in such an oval shape allows to limit a magnetization reversal path and allows adjustment for favorable characteristics.

7. Modification 3

Figure 10:
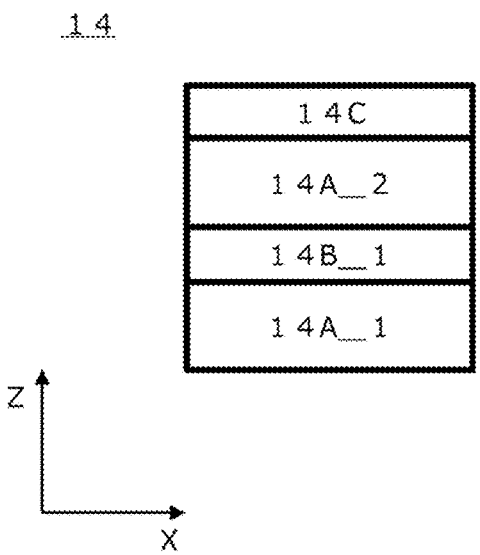
FIG. 10 shows an X-Z sectional view of a free layer illustrating a structure of a third modification of a magnetic tunnel junction element of the random number generation unit in the first embodiment according to the present invention.

FIG. 10 shows the X-Z sectional view related to a third modification, schematically illustrating the film structure of the free layer 14. The free layer 14 may include a cap layer 14C configured with non-magnetic material in the side of the upper electrode 15. Examples of material for the cap layer 14C include MgO. The free layer 14 may include a first ferromagnetic free layer 14A_1 and a second ferromagnetic free layer 14A_2 which are configured with ferromagnets and may further include a first non-magnetic insertion layer 14B_1 therebetween. For example, Co—Fe—B alloy and Fe—B alloy are usable for the first ferromagnetic free layer 14A_1 and the second ferromagnetic free layer 14A_2. For example, Ta and W are usable for the first non-magnetic insertion layer 14B_1.

The structure as shown in FIG. 10 allows the designing of magnetic anisotropy in the free layer 14 by utilizing the interface magnetic anisotropy generated on the two interfaces of the interface between the first ferromagnetic free layer 14A_1 and the barrier layer 13, and the interface between the second ferromagnetic free layer 14A_2 and the cap layer 14C. This allows the adjustment of the response characteristics to the input from the outside, temperature dependency, magnetization dynamics and the like.

8. Modification 4

Figure 11:
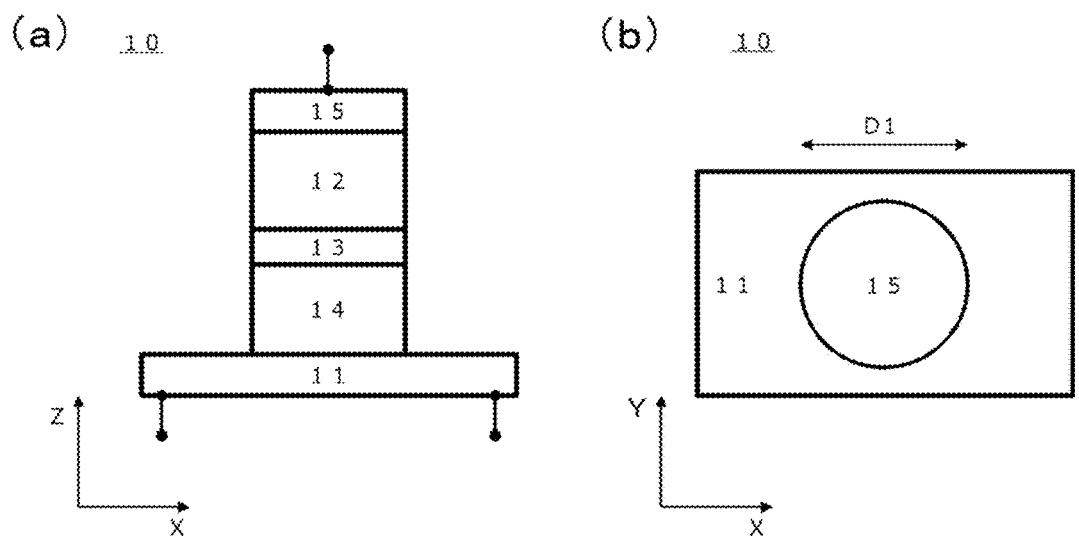
FIG. 11 includes (a) an X-Z sectional view and (b) an X-Y plan view each illustrating a structure of a fourth modification of a magnetic tunnel junction element of the random number generation unit in the first embodiment according to the present invention.

FIG. 11 schematically shows the structure of a fourth modification of the magnetic tunnel junction element 10, as one embodiment according to the present invention. FIG. 11(a) shows the X-Z sectional view, and FIG. 11(b) shows the X-Y plan view. The magnetic tunnel junction element 10 according to the fourth modification has three terminals. Two terminals among them are connected to the lower electrode 11, and the remaining one is connected to the upper electrode 15. The free layer 14 is formed on the upper surface of the lower electrode 11, and the fixed layer 12 is formed on the lower surface of the upper electrode 15.

In the embodiments described so far, spin transfer torque is applied to the free layer 14, while in the magnetic tunnel junction element 10 according to the fourth modification, the spin orbit torque (SOT) generated by the current introduced to the lower electrode 11 so as to flow in the in-plane direction is applied to the free layer 14. Examples of the source generating the spin orbit torque include spin hall effects, anomalous hall effects, topological hall effects, and Rashba-Edelstein effects. Non-Patent Literature 1 discloses the circuit structure of the random number generation unit 100 using the magnetic tunnel junction element 10 having three terminals, and thus the description thereof is omitted herein.

Example 1

Figure 12:
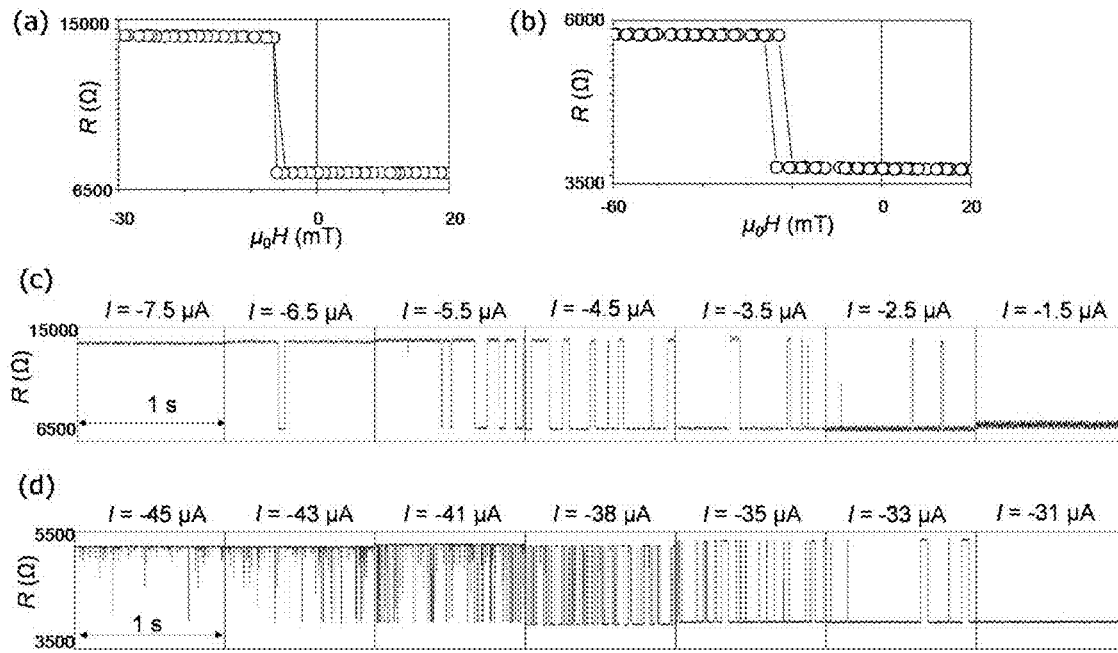
FIG. 12 includes (a) a graph showing external magnetic field dependency of resistance of a magnetic tunnel junction element formed in a film structure 1 of the random number generation unit in the first embodiment according to the present invention, and (b) a graph showing external magnetic field dependency of resistance of a magnetic tunnel junction element formed in a film structure 2, (c) a graph showing temporal fluctuation of resistance at the time of current in different levels applied to the magnetic tunnel junction element formed in the film structure 1, and (d) a graph showing temporal fluctuation of resistance at the time of current in different levels applied to the magnetic tunnel junction element formed in the film structure 2.

Hereinafter, by referring to the experimental results shown in FIG. 12 and FIG. 13, an example related to the first embodiment according to the present invention will be described. The magnetic tunnel junction elements were created by depositing the laminated films in a film structure 1 and a film structure 2 to be described below respectively on silicon substrates with thermal oxidation films by a vacuum magnetron sputtering method, and thereafter executing fine processing.

Film structure 1: Substrate/Ta(5)/Pt(5)/[Co(0.3)/Pt(0.4)]$_7$/Co(0.3)/Ru(0.45)/[Co(0.3)/Pt(0.4)]$_2$/Co(0.3)/Ta(0.3)/Co$_{18.75}$Fe$_{56.25}$B$_{25}$(1)/MgO(1.1)Co$_{18.75}$Fe$_{56.25}$B$_{25}$(t)Ta(5)/Ru(5), and Film structure 2: Substrate/Ta(5)/Pt(5)/[Co(0.3)/Pt(0.4)]$_6$/Co(0.3)/Ru(0.45)/[Co(0.3)/Pt(0.4)]$_2$/Co(0.3)/Ta(0.3)/Co$_{18.75}$Fe$_{56.25}$B$_{25}$(1)/MgO(1.1)Co$_{18.75}$Fe$_{56.25}$B$_{25}$(t)Ta(5)/Ru(5), when the subscripts next to the square brackets [ ] represent the number of times of repeated laminating process, and the subscripts next to the respective elements of CoFeB represent compositions (at %). The letter t represents a film thickness of the CoFeB free layer.

FIG. 12(a) and FIG. 12(b) show the measurement results of the external magnetic field dependency of the resistance of typical magnetic tunnel junction elements (serving as an element 1 and an element 2) configured with the laminated films in the film structure 1 and the film structure 2, respectively. The film thickness t is 1.90 nm. In the element 1, the shift magnetic field $\mu_0 H_{SHIFT}$ is 6 mT, while in the element 2, the shift magnetic field $\mu_0 H_{SHIFT}$ is 23 mT.

FIG. 12(c) and FIG. 12(d) show the temporal fluctuation of resistance at the time of current in different levels applied to the element 1 and the element 2, respectively. The figure reveals that, in the element 1 (FIG. 12(c)), the retention time in high-resistance state and the retention time in low-resistance state are approximately equal to each other in the range of the input current of −4.5 μA to −5.5 μA. When the current of −7.5 μA is applied, the element 1 is fixed to the high-resistance state, while when the current of −1.5 μA is applied, the element 1 is fixed to the low-resistance state. This is the characteristics of the magnetic tunnel junction element necessary for the execution of the probabilistic computing described with reference to FIG. 4. The figure reveals that, in the element 2 (FIG. 12(d)), the retention time in high-resistance state and the retention time in low-resistance state are approximately equal to each other in the case of the input current of −38 µA. The element 2 is fixed to the low-resistance state in the case of the current of −31 µA which is increased by 7 µA in the positive direction, while the element 2 is not fixed to the high-resistance state in the case of the current of −45 µA which is increased by 7 µA in the negative direction. This is the characteristics not suitable for the magnetic tunnel junction element configured to execute the probabilistic computing described with reference to FIG. 4. Detailed experimental results reveal that this behavior relates to the shift magnetic field in the magnetic tunnel junction element, and that such defect occurs when the absolute value of $\mu_0 H_{SHIFT}$ exceeds 20 mT. That is, in the embodiments according to the present invention, the absolute value of the shift magnetic field in the free layer 14 in the magnetic tunnel junction element 10 needs to be 20 mT or smaller.

Figure 13:
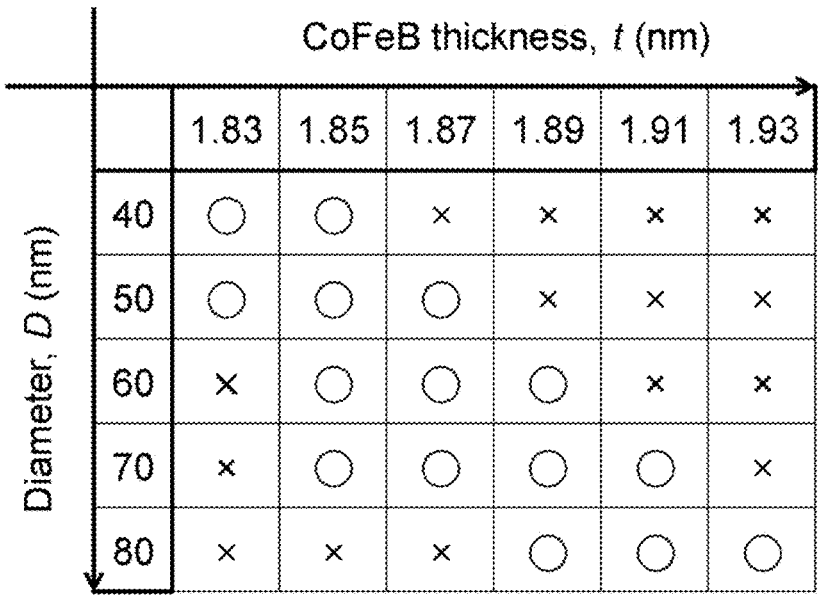
FIG. 13 shows a table indicating superiority and inferiority of characteristics of a large number of the magnetic tunnel junction elements formed in the film structure 1 having the free layers different in a diameter D and different in a CoFeB film thickness t, of the random number generation unit in the first embodiment according to the present invention.

FIG. 13 shows the measurement results in a table with respect to a large number of the elements having free layers which are different in the diameter D and different in the CoFeB film thickness t and are configured with the laminated films in the film structure 1. In FIG. 13, the elements having suitable characteristics for the execution of the probabilistic computing (specifically, temporal fluctuation of resistance with a time constant of one second or shorter) are expressed with circle, while the elements not having such suitable characteristics are expressed with cross. In the case of an element with a large diameter of the diameter D and with a very thin thickness of the CoFeB film thickness t, the time constant becomes excessively large. In the case of an element with a small diameter of the diameter D and with a very thick thickness of the CoFeB film thickness t, the magnetization easy axis extends in the in-plane direction, and the temporal fluctuation between the low-resistance state and the high-resistance state is not observed.

FIG. 13 reveals that an element with the relation between D (unit: nanometer; nm) and t (unit: nanometer; nm) satisfying $$500t-895<D<500t-855$$

has excellent characteristics. The above inequality represents the preferable relation between D and t found by the present inventors, in the embodiments according to the present invention. In practice, the ranges of the diameter and the film thickness allowing preferable characteristics may vary depending on material and film structure in use, thin film deposition method, element fabrication method and the like, and the preferable ranges may vary depending on those factors.

Figure 14:
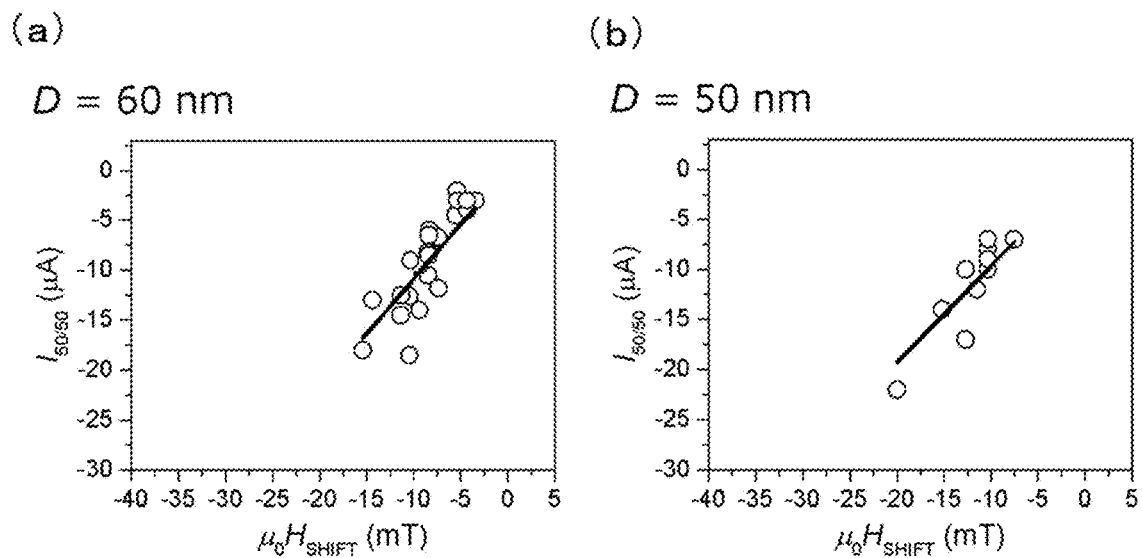
FIG. 14 shows graphs of relation between a shift magnetic field $H_{SHIFT}$ of a large number of the magnetic tunnel junction elements formed in the film structure 1 different in the CoFeB film thickness t and a current $I_{50/50}$ (corresponding to a shift current $I_{SHIFT}$) where a retention time in low-resistance state and a retention time in high-resistance state are equal to each other, with the diameter D of the free layer of (a) 60 nm and (b) 50 nm, of the random number generation unit in the first embodiment according to the present invention.

FIG. 14 shows the relation between the shift magnetic field $H_{SHIFT}$ of a large number of the created magnetic tunnel junction elements and the current $I_{50/50}$ (corresponding to the shift current $I_{SHIFT}$ described above) where the retention time in low-resistance state and the retention time in high-resistance state are equal to each other. FIG. 14(a) shows the measurement results of the elements designed with the diameter of 60 nm, and FIG. 14(b) shows the measurement results of the elements designed with the diameter of 50 nm. The linear relation between $H_{SHIFT}$ and $I_{50/50}$ is observed. As a result of fitting the measurement results by a linear function with the intercept of zero, the inclination as for the 60-nm-elements is 1.09±0.06, and the inclination as for the 50-nm-elements is 0.97±0.06.

The random number generation unit in the second embodiment according to the present invention, and the computing system using the same will be described next.

Figure 15:
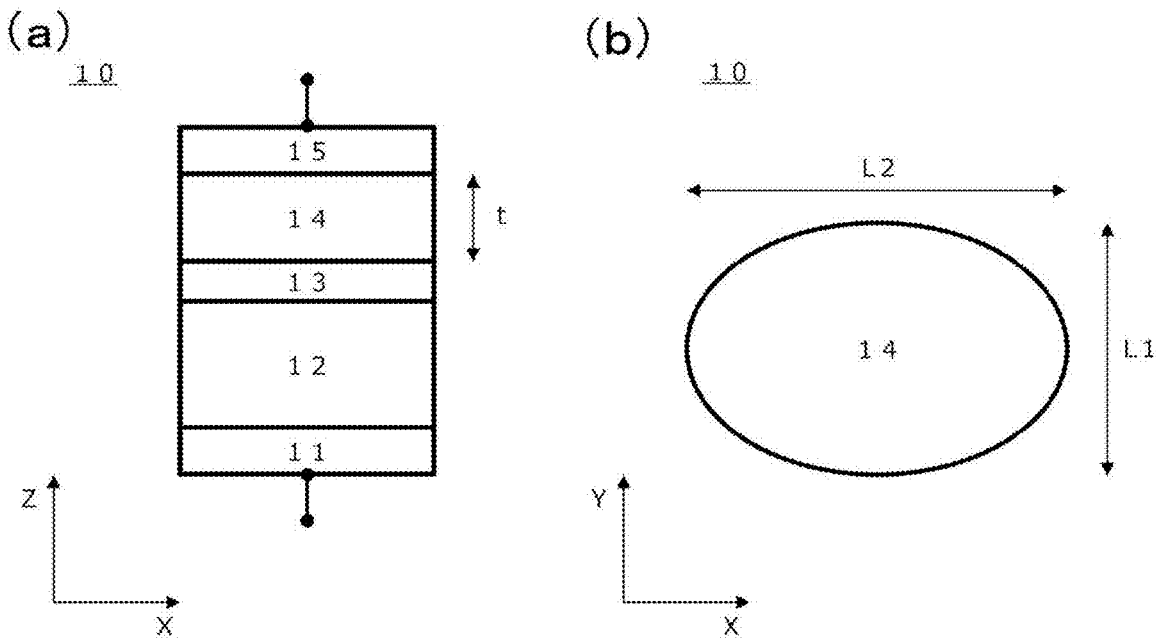
FIG. 15 includes (a) an X-Z sectional view and (b) an X-Y plan view each illustrating a structure of a magnetic tunnel junction element of a random number generation unit in a second embodiment according to the present invention.
Figure 16:
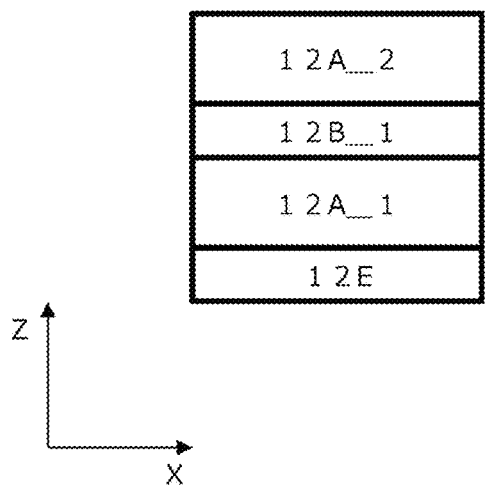
FIG. 16 shows an X-Z sectional view illustrating a structure of a fixed layer of the magnetic tunnel junction element of the random number generation unit in the second embodiment according to the present invention.
Figure 17:
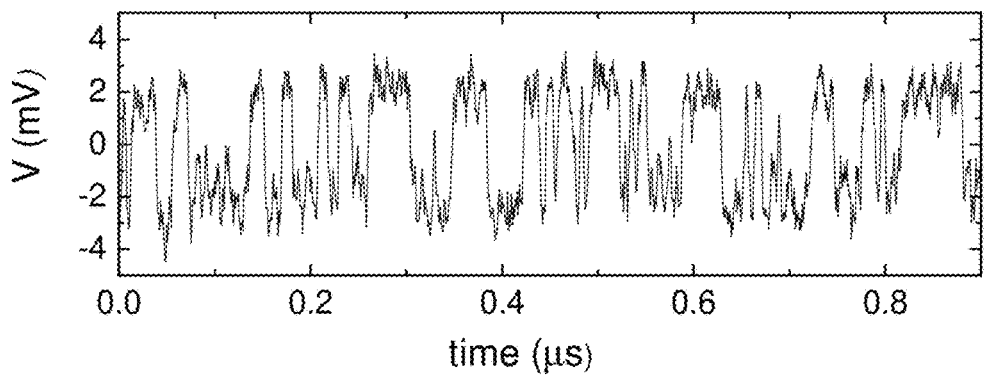
FIG. 17 includes (a) a graph showing temporal fluctuation of resistance and (b) a graph showing external magnetic field dependency of retention time in a parallel state (P) and an antiparallel state (AP) ($\tau_P$, $\tau_{AP}$) of a free layer, of the magnetic tunnel junction element in the second embodiment according to the present invention.
Figure 17:
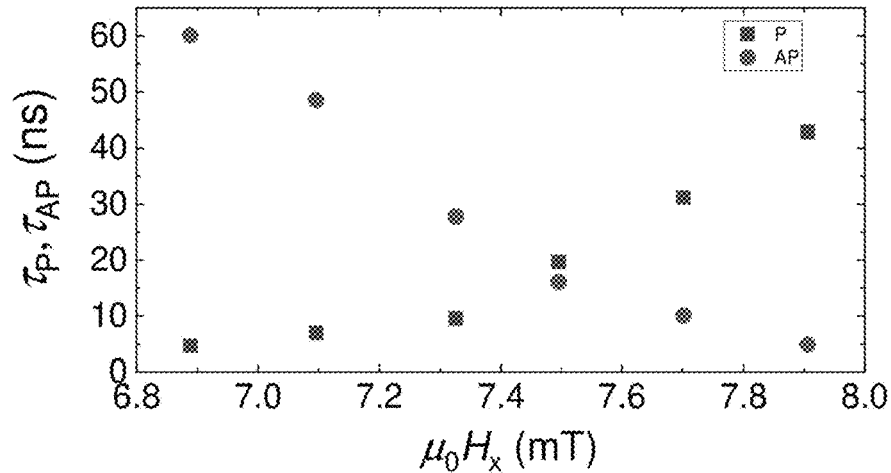

FIG. 15 to FIG. 17 show the random number generation unit in the second embodiment according to the present invention, and the computing system using the same. It is noted that in the following description, the same structures as those in the first embodiment according to the present invention are denoted by the same reference signs, and the descriptions thereof are omitted.

1. Basic Structure

The structures of the computing system and the random number generation unit in the second embodiment according to the present invention are the same as those in the first embodiment according to the present invention, and thus the descriptions thereof are omitted.

FIG. 15 schematically shows the structure of the magnetic tunnel junction element 10. FIG. 15(a) shows the X-Z sectional view, and FIG. 15(b) shows the X-Y plan view. The sectional structure of the magnetic tunnel junction element 10 in the second embodiment according to the present invention is also the same as the sectional structure in the first embodiment according to the present invention, and thus the description thereof is omitted. In the second embodiment according to the present invention, both of the fixed layer 12 and the free layer 14 which are included in the magnetic tunnel junction element 10 have easy axes of magnetization in the in-plane directions (in-plane magnetization easy axes). It is noted that the magnetization easy axis of this case extends along the X direction.

As shown in FIG. 15(b), the magnetic tunnel junction element 10 shall have a film plane formed in an oval shape with the short axis of the length L1 and the long axis of the length L2. The free layer 14 has the film thickness t.

2. Operation

The operation method of the random number generation unit 100 in the second embodiment according to the present invention is the same as the operation method in the first embodiment according to the present invention, and thus the description thereof is omitted.

3. Structure of Fixed Layer 12

FIG. 16 shows a representative sectional structure of the fixed layer 12 in the magnetic tunnel junction element 10 in the second embodiment according to the present invention. The fixed layer 12 is configured with the laminated layers of, in order from the substrate side (the side of the lower electrode 11), an antiferromagnetic layer 12E, the first ferromagnetic fixed layer 12A-1, the first non-magnetic coupling layer 12B_1, and the second ferromagnetic fixed layer 12A_2.

The first ferromagnetic fixed layer 12A_1 and the second ferromagnetic fixed layer 12A_2 are configured with ferromagnets, and their magnetization directions are fixed substantially. The first non-magnetic coupling layer 12B_1 is configured with non-magnetic metal material. The first ferromagnetic fixed layer 12A_1 and the second ferromagnetic fixed layer 12A_2 are coupled in terms of magnetization in an antiparallel manner via the first non-magnetic coupling layer 12B_1. The antiferromagnetic layer 12E is configured with an antiferromagnet. The magnetization direction in the first ferromagnetic fixed layer 12A_1 is specified by the exchange bias generated at the interface between the antiferromagnetic layer 12E and the first ferromagnetic fixed layer 12A_1. In order to apply this exchange bias, the magnetic tunnel junction element 10 is subjected to film formation in a magnetic field. Alternatively, the magnetic tunnel junction element 10 is subjected to heat treatment in a magnetic field after film formation.

The structure of the fixed layer 12, the characteristics of the responses to the external magnetic field and the input current of the free layer 14, and the relation between $H_{SHIFT}$ and $I_{SHIFT}$, and the like are the same as those in the first embodiment according to the present invention, and thus the descriptions thereof are omitted.

4. Material

The usable material for the respective layers of the magnetic tunnel junction element 10 and their film thicknesses will be described next.

Non-magnetic conductive metal is usable for the lower electrode 11 and the upper electrode 15. Specific examples include Ta, W, Ti, Ru, Cu, Cu—N, Ti—N, and Ta—N. Their film thicknesses are designed approximately in the range of 5 nanometers to 50 nanometers.

A conductive ferromagnet is usable for the first ferromagnetic fixed layer 12A_1 and the second ferromagnetic fixed layer 12A_2 which are included in the fixed layer 12. Specific examples include Co—Fe alloy, Co—Fe—Ni alloy, Co—Fe—B alloy, and Fe—B alloy. Non-magnetic conductive material is usable for the first non-magnetic coupling layer 12B_1 included in the fixed layer 12. In particular, the material capable of coupling in an antiparallel manner with the ferromagnetic layer formed on the opposite surface by RKKY interaction shall be used. Specific examples include Ru, Ir, and Rh. The film thickness is optimized and designed so as to obtain desired magnetic coupling by RKKY interaction, typically in the range of 0.3 nanometers to 1.5 nanometers. A conductive antiferromagnet is usable for the antiferromagnetic layer 12E included in the fixed layer 12. Specific examples include Pt—Mn alloy, Ir—Mn alloy, and Pd—Mn alloy.

Insulating non-magnetic material is usable for the barrier layer 13. In particular, MgO is used preferably. The film thickness is designed approximately in the range of 0.8 nanometers to 2.0 nanometers.

Ferromagnetic metal having high spin polarization is usable for the free layer 14. Specific examples include Co—Fe—B alloy and Fe—B alloy. The film thickness is designed approximately in the range of 1.2 nanometers to 4.0 nanometers.

5. Structure of Free Layer 14

In the second embodiment according to the present invention, the random number generation unit 100 is improved in the operating speed, and the magnetic tunnel junction element 10 with the time constant $t_1$ for fluctuation which is short is provided as the method for the improvement.

The present inventors have found that the time constant $t_1$ for fluctuation depends on a time $t_{dwell}$ which is a retention time in each state of 0 or 1 and a time $t_{transition}$ which is a time of transition between the states of 0 and 1. The present inventors further have found that the both values of $t_{dwell}$ and $t_{transition}$ are able to be reduced by designing the free layer 14 having the in-plane magnetization easy axis and having the film thickness and shape in appropriate ranges. The specific contents will be described below.

In the free layer 14 having the in-plane magnetization easy axis, the value of $t_{dwell}$ depends on the product of multiplication of a saturation magnetization $M_S$, an effective anisotropy magnetic field $H_K^{in}$ in the X-Y plane, and a volume V, and is allowed to be reduced by designing the product of multiplication to be smaller. The value of $t_{transition}$ depends on an effective magnetic anisotropy $H_K^{eff}$ in the direction perpendicular to the film plane (the Z direction) and is allowed to be reduced by designing the effective magnetic anisotropy to be smaller. Herein, $M_S$ or V is not allowed to be designed independently from other factors, while $H_K^{in}$ and $H_K^{eff}$ are allowed to be relatively freely designed so as to obtain desired characteristics with respect to $t_{dwell}$ and $t_{transition}$, respectively. The present inventors have found that $H_K^{in}$ is allowed to be designed relatively freely depending on the length L1 of the short axis and the length L2 of the long axis of the free layer 14 formed in an oval shape, while $H_K^{eff}$ is allowed to be designed relatively freely depending on the material and the film thickness t of the free layer 14. The present inventors, through the experiments to be described later, have found that $t_1$ becomes approximately 10 ns when L1 falls within the range of 10 nm to 150 nm; the value of L2/L1 falls within the range of 1.0 to 2.0; and t falls within the range of 1.5 nm to 2.8 nm. The present inventors have further found that more preferable characteristics are allowed to be obtained when L1 falls within the range of 20 nm to 120 nm; the value of L2/L1 falls within the range of 1.05 to 1.6; and t falls within the range of 1.8 nm to 2.4 nm.

It is noted that in the free layer 14 having the in-plane magnetization easy axis, the magnetization easy axis extends in the X direction. Designing of L2 and L1 with different values allows to design the direction of the magnetization easy axis and the magnitude of the anisotropy by shape magnetic anisotropy. Appropriate designing of the wiring and the passivation layer around the magnetic tunnel junction element 10 allows to design the direction of the magnetization easy axis and the magnitude of the anisotropy also by stress-induced magnetic anisotropy.

Example 2

Hereinafter, by referring to the experimental results shown in FIG. 17, an example related to the second embodiment according to the present invention will be described. The magnetic tunnel junction element was created by depositing the film structure to be described below on a silicon substrate with thermal oxidation film by a vacuum magnetron sputtering method, and thereafter executing fine processing.

Film structure: Substrate/Ta(5)/PtMn(20)/Co(2.6)/Ru(0.9)/CoFeB(2.4)/MgO/CoFeB(2.1)/Ta(5)/Ru(5)

The element was created by executing, after film formation, fine processing by electron beam lithography and argon ion milling, and subsequently processing an electrode by photolithography. When viewed under a scanning electron microscope, the magnetic tunnel junction element had the shape with the length of the short axis of 88 nm and the length of the long axis of 97 nm. After the creation of the element, the element was subjected to heat treatment for two hours at 300 degrees in the magnetic field of 1 tesla. An external magnetic field is applied to the created element so as to induce the reversal of magnetization in the free layer, and measurements were performed with respect to the resistance of the case where the magnetization of the free layer and the magnetization of the fixed layer are in a parallel state and the resistance of the case of being in an antiparallel state. The measurement results were 3.7 kΩ and 8.1 kΩ, respectively.

FIG. 17(a) shows typical measurement results of the temporal fluctuation of the resistance at the time when current and a magnetic field are applied to the created element. FIG. 17(a) shows the experimental results of the measurements performed with the magnitudes of the current and the magnetic field where the high-resistance state (antiparallel state) and the low-resistance state (parallel state) are observed with substantially the same probability. The measurement results reveal that the resistance transitions between the high-resistance state and the low-resistance state at the time interval of 10 ns.

FIG. 17(b) shows the external magnetic field dependency in the X direction of the retention time in the antiparallel state (AP) and the parallel state (P) ($\tau_{AP}$, $\tau_P$). The results reveal that as the magnetic field is stronger, the retention time in the antiparallel state ($\tau_{AP}$) is shorter, and the retention time in the parallel state ($\tau_P$) is longer. The results further reveal that the shift magnetic field is approximately at 7.5 mT. The values of $\tau_{AP}$ and $\tau_P$ at the time of the magnetic field of 7.5 mT were $\tau_{AP}$=16.1 ns and $\tau$=19.7 ns, and thus the value of $\tau_1$ was obtained in $\tau_1$=exp[ln ($\tau_P \times \tau_{AP}$)/2]=17.9 ns. At the same time, the value of $\tau_1$ of the created element in the measurement results falls approximately within the range of 9.2 ns to 300 ns. These values are smaller than any of the values having been reported so far, and accordingly obtained by applying the design method disclosed in the present invention.

Each of the random number generation units 100 in the first and second embodiments according to the present invention is usable for a purpose other than the computing system dedicated to probabilistic computing, and may be used as, for example, a random number generator for encryption.

REFERENCE SIGNS LIST

1: COMPUTING SYSTEM
10: MAGNETIC TUNNEL JUNCTION ELEMENT
11: LOWER ELECTRODE
12: FIXED LAYER
   12A_1: FIRST FERROMAGNETIC FIXED LAYER
   12A_2: SECOND FERROMAGNETIC FIXED LAYER
   12A_3: THIRD FERROMAGNETIC FIXED LAYER
   12A_N+1: N+1TH FERROMAGNETIC FIXED LAYER
   12B_1: FIRST NON-MAGNETIC COUPLING LAYER
   12B_2: SECOND NON-MAGNETIC COUPLING LAYER
   12B_N: NTH NON-MAGNETIC COUPLING LAYER
   12C: INTERLAYER
   12D: SPIN-POLARIZED LAYER
   12E: ANTIFERROMAGNETIC LAYER
13: BARRIER LAYER
14: FREE LAYER
   14A_1: FIRST FERROMAGNETIC FREE LAYER
   14A_2: SECOND FERROMAGNETIC FREE LAYER
   14B_1: FIRST NON-MAGNETIC INSERTION LAYER
   14C: CAP LAYER
15: UPPER ELECTRODE
100: RANDOM NUMBER GENERATION UNIT
200: WEIGHTED LOGIC
300: TIME AVERAGING CIRCUIT

What is claimed is:

1. A random number generating unit comprising a magnetic tunnel junction element,
the magnetic tunnel junction element having:
   a fixed layer including a ferromagnet and having a magnetization direction fixed substantially;
   a free layer including a ferromagnet and having a magnetization direction varying with a first time constant; and
   a barrier layer configured as an insulator and disposed between the free layer and the fixed layer,
the magnetic tunnel junction element having a shift magnetic field of an absolute value of 20 millitesla or smaller, wherein
the fixed layer has a plurality of ferromagnetic layers and non-magnetic coupling layers laminated one upon another, and ferromagnetic layers adjacent to each other among the respective ferromagnetic layers are coupled in terms of magnetization by the non-magnetic coupling layers in an antiparallel manner, and
the random number generating unit is configured to:
   output one of two output signals at random timing, the timing being independent of an input current or an input voltage, and
   control a probability of outputting each of the respective output signals based on the input current or the input voltage.

2. The random number generating unit according to claim 1, wherein
both of the fixed layer and the free layer have perpendicular magnetization easy axes.

3. The random number generating unit according to claim 1, wherein
the free layer contains Fe and B, and
the barrier layer contains Mg and O.

4. The random number generating unit according to claim 1, wherein
the free layer has a plane substantially in a circular shape satisfying relation of $$500t-895 < D < 500t-855,$$

when D represents a diameter of the free layer (unit: nanometer), and t represents a film thickness of the free layer (unit: nanometer).

5. The random number generating unit according to claim 1, wherein
both of the fixed layer and the free layer have in-plane magnetization easy axes.

6. The random number generating unit according to claim 5, wherein
the free layer has a plane in an oval shape with a length of a short axis in a range of 10 nm to 150 nm, and a length of a long axis equal to or double the length of the short axis.

7. The random number generating unit according to claim 5, wherein
the free layer has a film thickness in a range of 1.5 nm to 2.8 nm.

8. A computing system comprising:
a weighted logic;
a plurality of the random number generating units according to claim 1, the random number generating units connected to the weighted logic; and
a time averaging circuit, wherein
the time averaging circuit is configured to time average output signals of the respective random number generating units at a first time interval, and
the first time constant is equal to or smaller than 1/10 of the first time interval.

* * * * *